United States Patent [19]

Omi et al.

[11] Patent Number: 5,182,630
[45] Date of Patent: Jan. 26, 1993

[54] SEMICONDUCTOR DEVICE HAVING A PARTICULAR SHAPED DIE PAD AND COATED LOWER SURFACE

[75] Inventors: Susumu Omi, Tenri; Kazuya Fujita, Nabari, both of Japan

[73] Assignee: Sharp Kabushiki Kaisha, Osaka, Japan

[21] Appl. No.: 828,670

[22] Filed: Feb. 7, 1992

[30] Foreign Application Priority Data

Feb. 13, 1991 [JP] Japan .................. 3-020057

[51] Int. Cl.$^5$ ............... H01L 23/28; H01L 23/30; H01L 23/12
[52] U.S. Cl. ................... 257/787; 257/676
[58] Field of Search ................... 357/72, 70

[56] References Cited

U.S. PATENT DOCUMENTS 4,942,452  7/1990  Kitano et al. .................. 357/70

FOREIGN PATENT DOCUMENTS

| 0184854 | 8/1986 | Japan ............... 357/72 |
| 63-204753 | 8/1988 | Japan . |
| 0036056 | 2/1989 | Japan ............... 357/72 |
| 0187841 | 7/1989 | Japan ............... 357/72 |
| 0208846 | 8/1989 | Japan ............... 357/72 |
| 2-74065 | 3/1990 | Japan . |
| 0125644 | 5/1990 | Japan ............... 357/72 |

Primary Examiner—Rolf Hille
Assistant Examiner—S. V. Clark
Attorney, Agent, or Firm—Nixon & Vanderhye P.C.

[57] ABSTRACT

A semiconductor device is provided with: a semiconductor element having a mounting face; a lead frame including a die pad having an upper surface on which the semiconductor element is mounted with the mounting face facing to the upper surface of the die pad. The die pad has such an outer shape that a central portion of each sides opposed to each other is caved more inward than an outer shape of the mounting face of the semiconductor element. The semiconductor device is also provided with: a resin film coated on a lower surface of the die pad, and a portion of the mounting face of the semiconductor element, exposed at the central portion of each side of the die pad which is opposed to each other; and a package body made of molding compound for encapsulating the semiconductor element, the die pad and the resin film. The resin film is made of resin having a high adhesiveness with respect to the semiconductor element, the die pad and the molding compound of the package body.

6 Claims, 4 Drawing Sheets

SEMICONDUCTOR DEVICE HAVING A PARTICULAR SHAPED DIE PAD AND COATED LOWER SURFACE

BACKGROUND OF THE INVENTION

1. Field of the Invention

The present invention relates to a semiconductor device, and more particularly, to a semiconductor device including a semiconductor element such as an IC (integrated Circuit) encapsulated by molding compound.

2. Description of the Related Arts

There are various types of semiconductor devices using various types of packaging techniques. As one type of such various semiconductor devices, there is a semiconductor device of surface mount type, which has relatively reduced size and thickness and thus can be suitably mounted onto a circuit board etc., with its lower mounting height etc., such as a SOP (Small Outline Package) type semiconductor device, a QFP (Quad Flat Package) type semiconductor device, and so on. On the other hand, a semiconductor device of plastic encapsulated type, in which the semiconductor element, such as an IC, is encapsulated by plastic, is also well known, which can be constructed as the above-mentioned surface mount type, and is utilized in various kinds of electronics apparatuses.

The plastic surface mount semiconductor device is provided with a lead frame including a plurality of leads and a die pad, onto which a semiconductor element is mounted. The die pad as well as the semiconductor element is encapsulated in molding compound.

The inventors of the present invention know one type of such a lead frame used in the plastic surface mount semiconductor device, which includes a die pad portion as shown in FIG. 1.

The semiconductor element to be mounted on the die pad 50 in FIG. 1, has an outer plane shape same as that of the die pad 50, or an outer plane shape slightly smaller than the die pad 50 as indicated by the broken line B in FIG. 1.

FIG. 2, which consist of FIG. 2a to FIG. 2d, show one example of a semiconductor device in various conditions, which is manufactured with using such a lead frame including the die pad 50 in FIG. 1, and a semiconductor element, by means of a transfer-molding technique.

In FIG. 2a, a semiconductor element 51 is mounted i.e. die-bonded on the die pad 50, and is encapsulated in a molding compound 52.

In this kind of the semiconductor device, the moisture absorbed by the molding compound 52, during the storage stage before the soldering process of the semiconductor device, as shown in FIG. 2a, has a tendency to be concentrated, as indicated by a concentrated moisture D in FIG. 2b, to the interface between the die pad 50 and the molding compound 52. This interface has a relatively weak adhesion, at which the die pad 50 can be rather easily delaminated.

Here, the concentrated moisture D is likely to become a vapor E and thus expand as shown in FIG. 2c, when the semiconductor device is heated in the soldering process. At this time, a package crack F is generated in the molding compound 52, by the stress generated by the vapor E, as shown in FIG. 2d.

By the way, in case that the semiconductor device is manufactured by use of the die pad 50 shown in FIG. 1, the flexural stress generated by the vaporizing expansion of the moisture under the die pad, is expressed by the following expression (1), if it is resolved by means of a homogeneously distributed load model with fixing the peripheral of the rectangular shape plate (die pad), in which the flexural stress has its maximum value at the center of the longer side of the die pad.

$$\text{maximum flexural stress} = K(a/t)^2 P \qquad (1)$$

wherein,

P: vapor pressure (Kg/mm²)
a: the length of the shorter side of the die pad (mm)
K: a coefficient given by the aspect ratio (b/a) (as the value (b/a) increases, K increases)
b: the length of the longer side of the die pad (mm)
t: the thickness of the resin under the die pad (mm).

As clearly indicated by this expression (1), the stress applied to the central portion in the longer side of the die pad, becomes larger, as the size of the die pad becomes larger.

Accordingly, as the size of the semiconductor element increases and as the size of the package decreases, the possibility or the fear of the package crack generation increases, so that the counter-measure is strongly desired especially in the case of the plastic surface mount semiconductor device such as a SOP type or QFP type semiconductor device, in the practical sense.

One method as the counter-measure for this problem, is proposed in the Japanese Patent Application Laying Open No. 63-204753, in which a die pad having an outer plane shape smaller than the semiconductor element to be mounted thereon, is employed. However, if the area of the die pad is made smaller, the contacting area between the semiconductor element and the die pad is also made smaller, to cause such a problem that the semiconductor element is delaminated easily during assembling, or the package body is broken. In addition, the degradation of the heat removal capability due to the increase of the heat resistance, is also the problem in this technique.

On the other hand, there is also proposed, in Japanese Patent Application Laying Open No. 2-74065, such a technique that a die pad having a shape of letter "X", is employed to prevent the package crack. However, in this technique, the problem of the above-mentioned degradations of the heat radiation ability and the physical strength of the lead frame and the package body, becomes even more serious.

Accordingly, under the progress of the large-sized semiconductor element and the miniaturization of the package body, an effective technique to prevent the package crack is desired.

SUMMARY OF THE INVENTION

It is therefore an object of the present invention to provide a semiconductor device, in which the generation of the package crack is effectively prevented.

According to the present invention, the above mentioned object can be achieved by a semiconductor device provided with: a semiconductor element having a mounting face; a lead frame including a die pad having an upper surface on which the semiconductor element is mounted with the mounting face facing to the upper surface of the die pad. The die pad has such an outer shape that a central portion of each sides opposed to each other is caved more inward than an outer shape of the mounting face of the semiconductor element. The semiconductor device is also provided with: a resin film coated on a lower surface of each side of the die pad which is opposed to each other, and a portion of the mounting face exposed at the central portion of the die pad; and a package body made of molding compound for encapsulating the semiconductor element, the die pad and the resin film. The resin film is made of resin having a high adhesiveness with respect to the semiconductor element, the die pad and the molding compound of the package body.

In the semiconductor device of the present invention, since the die pad has the outer shape that the central portion of each sides is caved more inward than the outer shape of the mounting face of the semiconductor element, even if the delamination is generated at the central portion of the die pad, where the delamination is most likely generated as aforementioned, the width of the generated delamination can be narrowed according to the caved degree of the sides of the die pad. Namely, the stress, which is to be generated when the moisture is vaporized by heat in the soldering process, can be made little. Here, since the lower surface of the die pad and the portion of the mounting face of the semiconductor element exposed at the central portion of each side of the die pad which is opposed to each other, is coated with the resin film, which has a high adhesiveness with respect to the semiconductor element, the die pad and the molding compound of the package body, the adhesiveness per unit area of the die pad can be made large compared with the aforementioned related art cases, in which the molding compound is directly adhered to the die pad and the semiconductor element. Accordingly, though the adhered area of the die pad at its central portion is reduced, the adhesiveness at the central portion can be improved, and thus, the possibility of generation of the delamination itself at this central portion and its vicinity, can be effectively reduced, so that the concentration of the absorbed moisture to the interface of these die pad and the molding compound, can be effectively prevented during the storing stage of the semiconductor device before the soldering process.

Further, because of the existence of two interfaces, i.e. the interface between the die pad and the resin film, and the interface between the resin film and the molding compound, the concentration of the moisture can be dispersed, so that the possibility of generation of the delamination can be even more reduced compared with the related art cases, in which only one interface exists where the moisture is concentrated.

Consequently, even if the delamination is really generated in the semiconductor device of the present invention, the stress generated by the vapor under the high temperature of the soldering process, can be made quite little. In addition, because of the existence of the two interfaces, the generated stress can be dispersed so that the possibility of the crack generation can be lowered.

In this manner, such a condition can be realized that the crack is very difficult to be generated into the package body at the vicinity of the adhered portion of the die pad.

Further objects and advantages of the present invention will be apparent from the following description of the preferred embodiment of the invention as illustrated in the accompanying drawings.

DETAILED DESCRIPTION OF THE PREFERRED EMBODIMENT

A preferred embodiment of the present invention will be described below with reference to the accompanying drawings.

Figure 3:
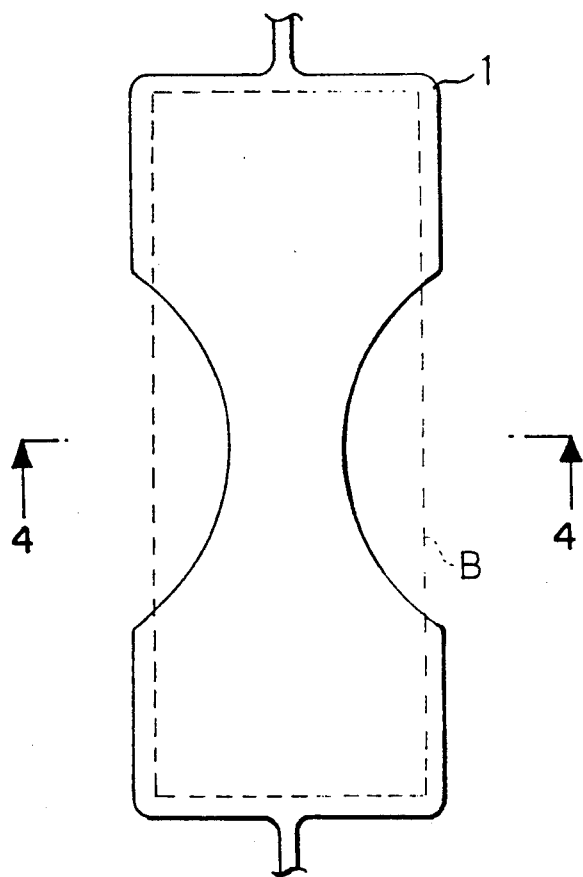
FIG. 3 is a plan view of a die pad of a lead frame in a semiconductor device as one embodiment of the present invention.

FIG. 3 shows a die pad of a lead frame used in a semiconductor device as an embodiment of the present invention.

In FIG. 3, a die pad 1 has such a plane shape that each central portion at each longitudinal side, is caved inward in a half moon shape toward the center.

The broken line B shows the plane shape of a semiconductor element which is to be mounted on the surface of the die pad 1. Since the die pad 1 is slenderized in its width at its central portion, the portion of the mounting face of the semiconductor element facing to the die pad 1, is exposed at both sides of its back surface, corresponding to the slenderized portion of the die pad 1. The lead frame including the die pad 1, also includes a plurality of leads, each of which is connected to each bonding pad or each electrode terminal of a semiconductor element mounted on the die pad 1.

Figure 4:
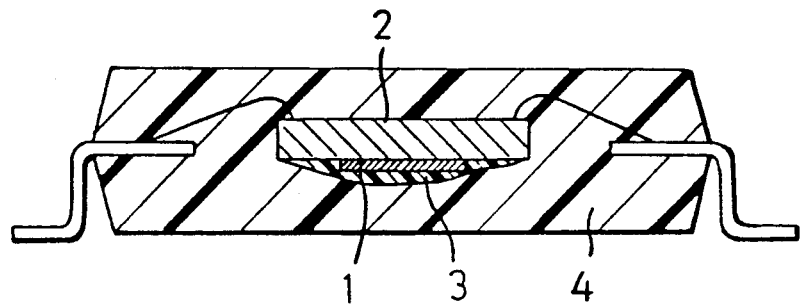
FIG. 4 is a cross sectional view of a semiconductor device as one embodiment of the present invention.

FIG. 4 shows a surface mount semiconductor device, which is manufactured by means of transfer-molding technique and in which the semiconductor element is mounted on the die pad 1 of FIG. 3, as one embodiment of the present invention. Here, FIG. 4 corresponds to an A—A profile of FIG. 3.

In FIG. 4, a semiconductor element 2 is mounted i.e. die bonded on the upper surface of the die pad 1. The inner lead portions formed of the lead frame are connected to the bonding pads of the semiconductor element 1 correspondingly by means of a wire bonding technique. The inner lead portion may be connected with the bonding pad by means of a wire-less bonding technique instead.

At the lower surface of the die pad 1, and at the portion of the mounting face of the semiconductor element 2 which faces downward and is exposed from both sides of the die pad 1, there is coated a resin film 3, composed of high adhesive type resin. The die pad 1, the semiconductor element 2, and the resin film 3, are encapsulated in a molding compound 4, by means of a transfer-molding technique for example, so as to form a main body of the package. In this manner, the semiconductor device of the present embodiment, is constructed as a SOP or QFP type semiconductor device.

Here, the high adhesive type resin composing the resin film 3, is resin having a high adhesiveness with respect to the die pad 1, the molding compound 4, and the semiconductor element 2. More concretely, as the high adhesive type resin, such a resin is preferably utilized that has an adhesiveness, with respect to the semiconductor element 2 and the die pad 1, higher than the molding compound 4, and has an adhesiveness, with respect to the molding compound 4, higher than the semiconductor element 2 and the die pad 1. Such a high adhesive type resin is preferably selected according to the materials of these die pad 1, the semiconductor element 2, and the molding compound 4.

By the way, the cause of the generation of the package crack, is that the moisture concentrated at the delaminated portion between the die pad and the molding compound is expanded as the vapor by heat, so as to generate the stress at the same portion, as aforementioned with respect to the related art device. Accordingly, as the area of the delaminating portion is reduced, the stress at this portion is reduced so that the chance of the crack generation can be reduced. And that, in order to prevent such a crack generation, it is effective to prevent the generation of the delamination itself between the die pad 1 and the molding compound 4.

Figure 5:
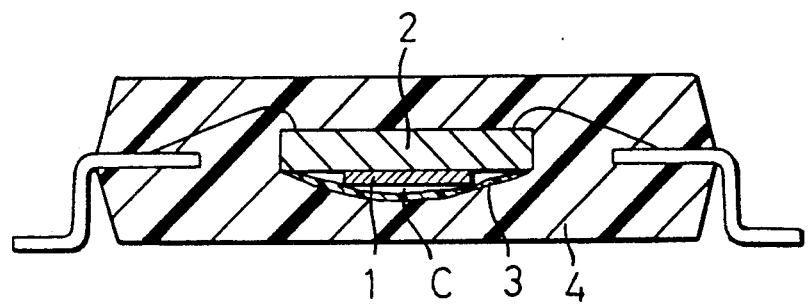
FIG. 5 is a cross sectional view of the semiconductor device of FIG. 4, in one condition of delamination.
Figure 6:
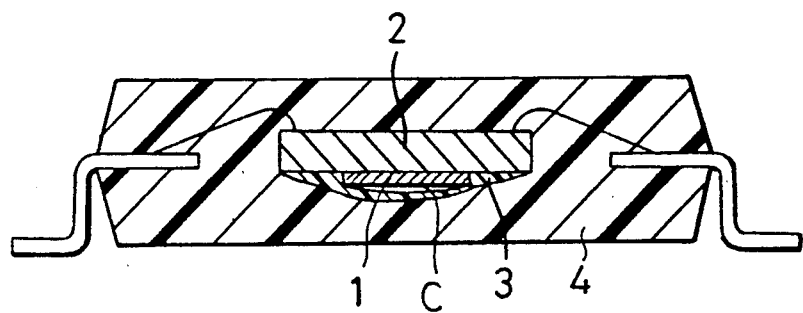
FIG. 6 is a cross sectional view of the semiconductor device of FIG. 4, in another condition of delamination.

The semiconductor device of the present embodiment, employs the die pad 1, which is slenderized at its central portion where the maximum stress is to be applied. Accordingly, as shown in FIG. 5, even when a delamination C is generated at the lower surface of the die pad 1 with respect to the molding compound 4 via the resin film 3, the width of the generated delamination C is made quite little in its width. And that, even if the delamination C is proceeded, as shown in FIG. 6, it is stopped at the edge of the semiconductor element 2. Consequently, even when the delamination C is generated in the semiconductor device of the present embodiment at its central portion, the width of the delamination is narrower than that of the aforementioned related art case. As a result, the generated stress can be made rather little, and thus the chance of the crack generation is quite little.

Here, in the semiconductor device of the present embodiment, the resin film 3 is coated on the lower surface of the die pad 1 and on the portion of the mounting face of the semiconductor element which is exposed at both sides of the die pad 1. The resin film 3 has a high adhesiveness with respect to the die pad 1, the molding compound 4, and the semiconductor element 2. Accordingly, though the central portion of the die pad 1 is constructed to be slenderized, since the adhesiveness per unit area is increased at this central portion, the delamination between the die pad 1 and the molding compound 4, and the delamination between the semiconductor element 2 and the molding compound 4, are effectively prevented to be generated at this central portion, so that the chance of the crack generation can be greatly reduced.

The Tables 1 and 2 show the results of the experiments in which the ratios of the crack generation are investigated with respect to the present embodiment, the aforementioned related art, and the comparison example.

Figure 1:
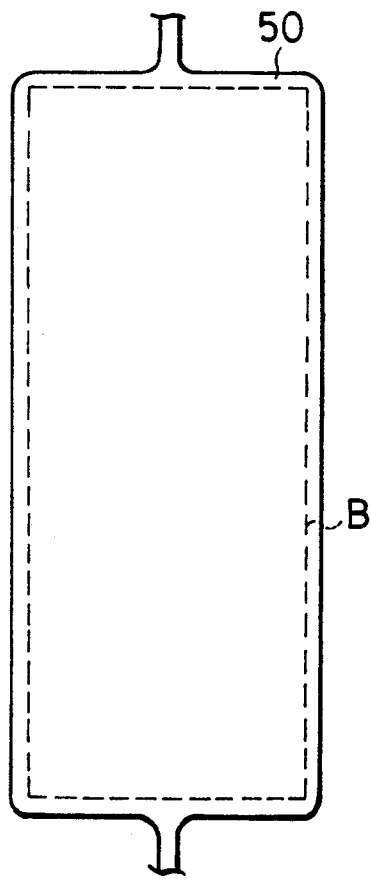
FIG. 1 is a plan view of a die pad of a lead frame in a related art technique.
Figure 2A:
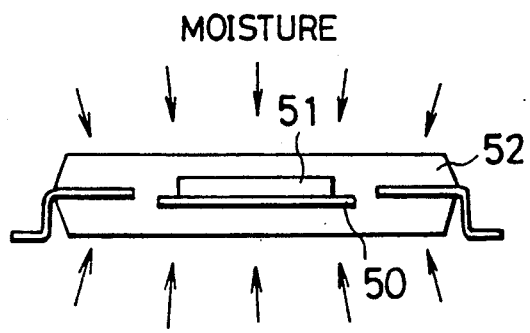
FIG. 2 which consist of FIG. 2a to FIG. 2d, are schematic cross sectional views of a semiconductor device, employing the die pad of FIG. 1, in various conditions of delamination.
Figure 2B:
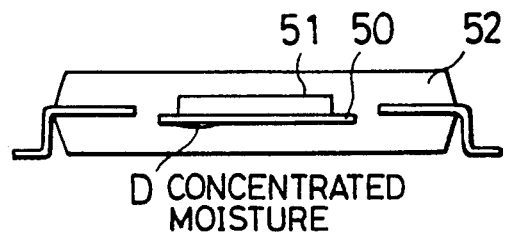
Figure 2C:
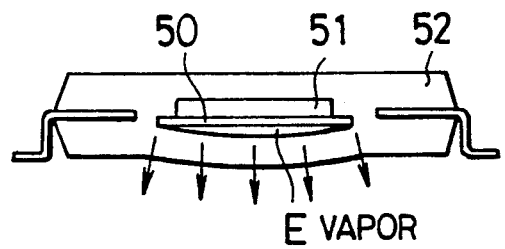
Figure 2D:
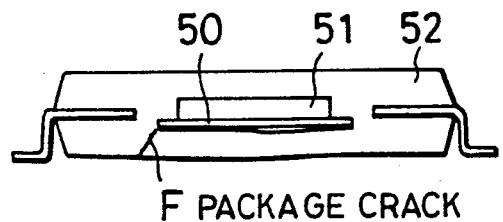

Table 1 shows the results of the experiments as for the semiconductor device of FIG. 2, which employs the die pad 50 of FIG. 1, and the semiconductor device of the comparison example, which employs the die pad 1 of FIG. 3 but does not employ the resin film 3. The comparison example has the same structure as the present embodiment of FIG. 4 except the absence of this resin film 3.

These experiments are performed under the condition that the package is a 44 pins SOP (28.2×16.0×2.70 (mm$^3$)), the semiconductor element 2 has a chip size (5.23×9.10 (mm$^2$)), the moisture absorbing condition is 85° C./75% RH.336 HR (saturated condition), and the IR reflow condition is 230° C. Max (package surface temperature), while the ratio of the crack generation is observed after the moisture absorbing process and the IR reflowing process.

As clearly understood from this Table 1, the ratio of the crack generation in the comparison example is much lower than that of the semiconductor device of FIG. 2.

On the other hand, Table 2 shows the results of the experiments as for the comparison example, and the semiconductor device of the present invention of FIG. 4, which employs the die pad 1 of FIG. 3, and the resin film 3.

These experiments are performed under the condition that the package is a 64 pins SOP (26.3×11.2×2.70 (mm$^3$)), the semiconductor element 2 has a chip size (4.94×12.40 (mm$^2$)), the moisture absorbing condition is 85° C./75% RH.336 HR (saturated condition), and the IR reflow condition is 220° C. Max (package surface temperature), while the ratio of the crack generation is observed after the moisture absorbing process and the IR reflowing process.

As clearly understood from this Table 2, the ratio of the crack generation in the present invention is much lower than that of the comparison example.

From these Tables 1 and 2, it is understood that the use of both the die pad 1 of FIG. 3 and the resin film 3 of FIG. 4 as in the present embodiment, is quite effective to prevent the crack generation.

TABLE 1

| OBJECT OF EXPERIMENT | RATIO OF CRACK GENERATION (%) |
|---|---|
| RELATED ART EXAMPLE (USING DIE PAD OF FIG. 1) | 67 |
| COMPARISON EXAMPLE (USING DIE PAD OF FIG. 3) | 20 |
| PACKAGE | 44PIN SOP (28.2 × 16.0 × 2.70) |
| CHIP SIZE | 5.23 × 9.10 |
| MOISTURE ABSORBING CONDITION | 85° C./75% RH · 336HR (SATURATED CONDITION) |
| IR REFLOW CONDITION | 230° C. Max. (PACKAGE SURFACE TEMPERATURE) |

TABLE 2

| OBJECT OF EXPERIMENT | RATIO OF CRACK GENERATION (%) |
|---|---|
| COMPARISON EXAMPLE (USING DIE PAD OF FIG. 3) | 100 |
| PRESENT EMBODIMENT (USING DIE PAD OF FIG. 3) AND RESIN FILM 3) | 0 |
| PACKAGE | 64PIN SOP (26.3 × 11.2 × 2.70) |
| CHIP SIZE | 4.94 × 12.40 |
| MOISTURE ABSORBING CONDITION | 85° C./75% RH · 336HR (SATURATED CONDITION) |
| IR REFLOW CONDITION | 220° C. Max. (PACKAGE SURFACE TEMPERATURE) |

Many widely different embodiments of the present invention may be constructed without departing from the spirit and scope of the present invention. It should be understood that the present invention is not limited to the specific embodiments described in this specification, except as defined in the appended claims.

What is claimed is:

1. A semiconductor device comprising:
   a semiconductor element having a mounting face;
   a lead frame including a die pad having an upper surface on which said semiconductor element is mounted with said mounting face facing to said upper surface, said die pad having such an outer shape that a central portion of each sides opposed to each other is caved more inward than an outer shape of said mounting face;
   a resin film coated on a lower surface of said die pad, and a portion of said mounting face exposed at said central portion of each side of said die pad which is opposed to each other; and
   a package body comprising molding compound for encapsulating said semiconductor element, said die pad and said resin film,
   said resin film comprising resin having a high adhesiveness with respect to said semiconductor element, said die pad and said molding compound of said package body.

2. A semiconductor device according to claim 1, wherein said semiconductor device comprises a SOP (Small Outline Package) type semiconductor device.

3. A semiconductor device according to claim 1, wherein said semiconductor device comprises a QFP (Quad Flat Package) semiconductor device.

4. A semiconductor device according to claim 1, wherein said die pad is caved inward such that a portion having a half moon shape is absent at said each side.

5. A semiconductor device according to claim 1, wherein an outer shape of a portion of said die pad except said central portion, is the same as or slightly larger than said mounting face of said semiconductor element.

6. A semiconductor device according to claim 1, wherein said resin of said resin film has an adhesiveness higher than that of said molding compound with respect to said semiconductor element and said die pad, and higher than those of said semiconductor element and said die pad with respect to said molding compound.

* * * * *